(12) United States Patent
Mashimo et al.

(10) Patent No.: US 9,603,195 B2
(45) Date of Patent: Mar. 21, 2017

(54) SUBSTRATE HEAT TREATMENT APPARATUS

(71) Applicant: CANON ANELVA CORPORATION, Kawasaki-shi (JP)

(72) Inventors: Kaori Mashimo, Kawasaki (JP); Masami Shibagaki, Hachioji (JP)

(73) Assignee: CANON ANELVA CORPORATION, Kawasaki-Shi, Kanagawa (JP)

( * ) Notice: Subject to any disclaimer, the term of this patent is extended or adjusted under 35 U.S.C. 154(b) by 297 days.

(21) Appl. No.: 14/314,348

(22) Filed: Jun. 25, 2014

(65) Prior Publication Data

US 2014/0308028 A1    Oct. 16, 2014

Related U.S. Application Data

(63) Continuation of application No. PCT/JP2012/006057, filed on Sep. 24, 2012.

(30) Foreign Application Priority Data

Dec. 27, 2011    (JP) .................... 2011-286544

(51) Int. Cl.
*H05B 3/00*    (2006.01)
*H01L 21/687*    (2006.01)
(Continued)

(52) U.S. Cl.
CPC ....... *H05B 3/0038* (2013.01); *C23C 16/4585* (2013.01); *H01L 21/67109* (2013.01);
(Continued)

(58) Field of Classification Search
CPC ......... H01L 21/67115; H01L 21/67751; H01L 21/68742; C23C 16/4585
See application file for complete search history.

(56) References Cited

U.S. PATENT DOCUMENTS 5,444,217 A * 8/1995 Moore ................ C23C 16/4404
219/405
5,580,388 A * 12/1996 Moore ................ C23C 16/4404
118/500
(Continued)

FOREIGN PATENT DOCUMENTS

JP    2001-210597 A    8/2001
JP    2005-045213 A    2/2005
(Continued)

OTHER PUBLICATIONS

Office Action (Notification of the First Office Action) issued on Dec. 4, 2015, by the State Intellectual Property Office of the Peoples Republic of China in corresponding Chinese Application No. 201280066626.1, and an English translation of the Office Action. (15 pages).

(Continued)

*Primary Examiner* — David Angwin
*Assistant Examiner* — John J Norton
(74) *Attorney, Agent, or Firm* — Buchanan Ingersoll & Rooney PC

(57) ABSTRACT

An apparatus includes a C-shaped susceptor including a first substrate placement portion capable of placing the substrate, and an opening portion, a substrate stage including a second substrate placement portion capable of placing the substrate, and a susceptor support portion configured to support the susceptor, and a complementary portion formed separately from the susceptor support portion, engaged with the susceptor support portion, and configured to complement an opening portion of the susceptor to form the susceptor into an annular shape in a state in which the susceptor support portion supports the susceptor. When the substrate is placed on the second substrate placement portion and the second substrate placement portion is located at a predetermined distant position with respect to the heat radiation surface, the (Continued)

susceptor forms the annular shape together with the complementary portion to surround the substrate.

12 Claims, 9 Drawing Sheets

(51) Int. Cl.
*H01L 21/67* (2006.01)
*C23C 16/458* (2006.01)
*H01L 21/677* (2006.01)

(52) U.S. Cl.
CPC .. *H01L 21/67115* (2013.01); *H01L 21/67751* (2013.01); *H01L 21/68742* (2013.01); *H01L 21/68764* (2013.01); *H01L 21/68785* (2013.01); *H05B 3/009* (2013.01); *H05B 3/0047* (2013.01)

(56) References Cited

U.S. PATENT DOCUMENTS

| | | | |
|---|---|---|---|
| 5,683,518 A | 11/1997 | Moore et al. | |
| 5,710,407 A * | 1/1998 | Moore | C23C 16/4404 118/725 |
| 5,820,686 A * | 10/1998 | Moore | C23C 16/4581 118/500 |
| 6,007,635 A * | 12/1999 | Mahawili | C23C 16/4584 118/500 |
| 6,310,327 B1 * | 10/2001 | Moore | C23C 16/4404 118/724 |
| 7,128,806 B2 * | 10/2006 | Nguyen | H01J 37/321 118/720 |
| 2003/0015141 A1 * | 1/2003 | Takagi | C23C 16/4585 118/728 |
| 2003/0019585 A1 * | 1/2003 | Tometsuka | C23C 16/4583 156/345.51 |
| 2009/0139448 A1 | 6/2009 | Hirata et al. | |
| 2009/0190908 A1 | 7/2009 | Shibagaki | |
| 2009/0200251 A1 * | 8/2009 | Shimizu | C23C 16/45544 211/41.18 |
| 2012/0031953 A1 * | 2/2012 | Park | H01L 21/67778 228/19 |

FOREIGN PATENT DOCUMENTS

| | | |
|---|---|---|
| JP | 2009-135228 A | 6/2009 |
| JP | 4288309 B2 | 7/2009 |
| TW | 200936802 A | 9/2009 |

OTHER PUBLICATIONS

Office Action (Grounds for Rejection) issued on Sep. 14, 2015, by the Japanese Patent Office in corresponding Japanese Patent Application No. 2013-551187 and an English translation of the Office Action. (8 pages).

International Search Report (PCT/ISA/210) mailed on Dec. 4, 2012, by the Japanese Patent Office as the International Searching Authority for International Application No. PCT/JP2012/006057.

Written Opinion (PCT/ISA/237) mailed on Dec. 4, 2012, by the Japanese Patent Office as the International Searching Authority for International Application No. PCT/JP2012/006057.

* cited by examiner

F I G. 6
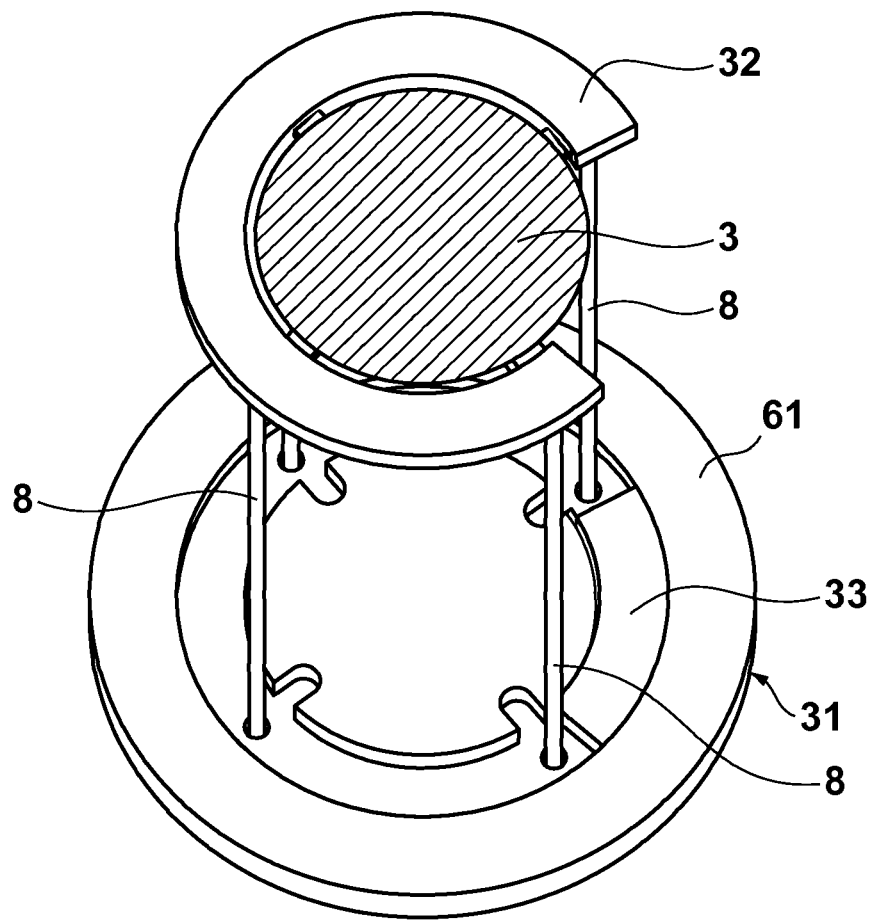

SUBSTRATE HEAT TREATMENT APPARATUS

This application is a continuation of International Patent Application No. PCT/JP2012/006057 filed on Sep. 24, 2012, and claims priority to Japanese Patent Application No. 2011-286544 filed on Dec. 27, 2011, the entire content of both of which is incorporated herein by reference.

TECHNICAL FIELD

The present invention relates to a substrate heat treatment apparatus and, more particularly, to a substrate heat treatment apparatus capable of uniformly, quickly heating, for example, a silicon carbide (SiC) substrate in a vacuum.

BACKGROUND ART

As a substrate heat treatment apparatus, there is known a substrate heat treatment apparatus in which a substrate is placed on a horseshoe susceptor and heated. Patent literature 1 describes that the second horseshoe susceptor for placing part of a substrate is placed on the first susceptor (susceptor main body) for placing a substrate. Patent literature 1 also describes that a support pin capable of supporting the second susceptor is arranged below the second susceptor and the second susceptor is moved up and down by moving up and down the support pin. In the arrangement of patent literature 1, the first susceptor and the second horseshoe susceptor are combined into a disk shape. The first susceptor has at its periphery a notch in which the horseshoe susceptor is just fitted.

As an apparatus which quickly heats a substrate, there is known a substrate heat treatment apparatus which quickly heats a substrate to a high temperature of 1,500° or more by radiant heat from the heat radiation surface of a heating unit, as in patent literature 2.

CITATION LIST

Patent Literature

PTL 1: Japanese Patent Laid-Open No. 2001-210597 (FIG. 6)
PTL 2: Japanese Patent No. 4288309

SUMMARY OF INVENTION

Technical Problem

However, when a susceptor as in patent literature 1 is used in an apparatus which quickly heats a substrate to a high temperature by radiant heat from the heat radiation surface of a heating unit, as in patent literature 2, the in-plane temperature distribution of a substrate to be heated may become nonuniform.

The present invention has been made to solve the conventional problems, and has as its object to provide a substrate heat treatment technique capable of improving the uniformity of the in-plane temperature distribution of a substrate even when the substrate is heated quickly.

Solution to Problem

To achieve the above object, according to one aspect of the present invention, there is provided a substrate heat treatment apparatus which performs heat treatment on a substrate in a vacuum processing chamber, comprising: a C-shaped susceptor including a first substrate placement portion capable of placing the substrate, and an opening portion; a substrate stage including a second substrate placement portion capable of placing the substrate, and a susceptor support portion configured to support the susceptor; a heating unit, including a heat radiation surface at a position above the substrate stage at which the heat radiation surface faces the second substrate placement portion, configured to heat the substrate placed on the second substrate placement portion by heat from the heat radiation surface; a moving unit configured to move the substrate stage to set the second substrate placement portion at a predetermined distant position with respect to the heat radiation surface; a lift portion configured to come into contact with a lower surface of the susceptor at a substrate acceptance position and support the susceptor in a state in which the susceptor is spaced apart from the susceptor support portion; and a complementary portion formed separately from the susceptor support portion, engaged with the susceptor support portion, and configured to complement an opening portion of the susceptor to form the susceptor into an annular shape in a state in which the susceptor support portion supports the susceptor, wherein when the substrate is placed on the second substrate placement portion and the second substrate placement portion is located at the predetermined distant position with respect to the heat radiation surface, the susceptor forms the annular shape together with the complementary portion to surround the substrate.

Advantageous Effects of Invention

The present invention can improve the uniformity of the in-plane temperature distribution of a substrate even when the substrate is heated quickly.

Further features of the present invention will become apparent from the following description of exemplary embodiments with reference to the attached drawings. Note that the same reference numerals denote the same or similar parts throughout the accompanying drawings.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 6 is a perspective view showing a state in which the substrate is supported by a susceptor in FIG. 4;

DESCRIPTION OF EMBODIMENTS

An embodiment of the present invention will now be described with reference to the accompanying drawings. Note that the building components set forth in the embodiment are merely examples, and are not intended to limit the scope of the present invention to them.

Figure 1:
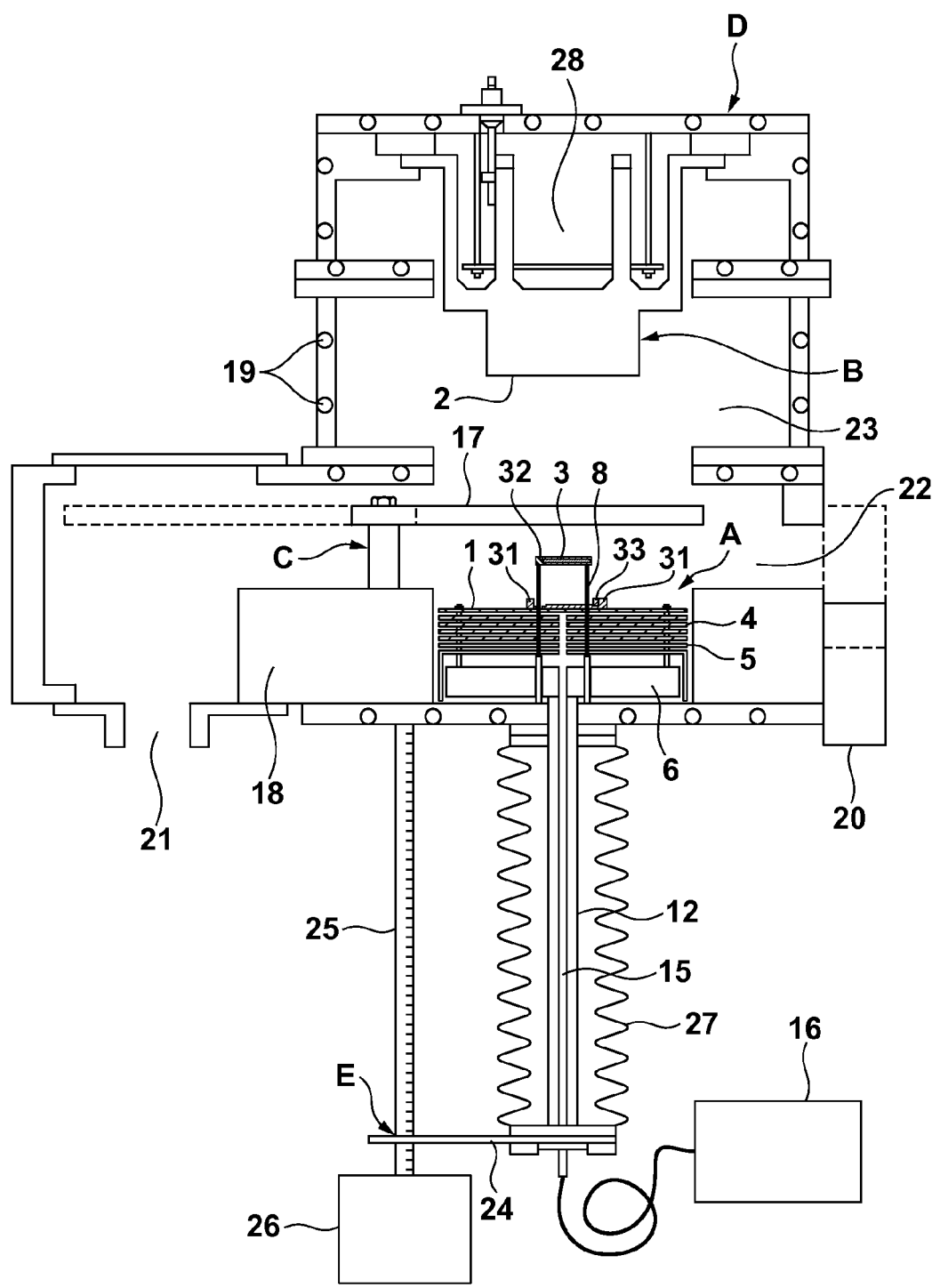
FIG. 1 is a schematic sectional view showing a state when a substrate is loaded or unloaded in a substrate heat treatment apparatus according to an embodiment of the present invention.
Figure 2:
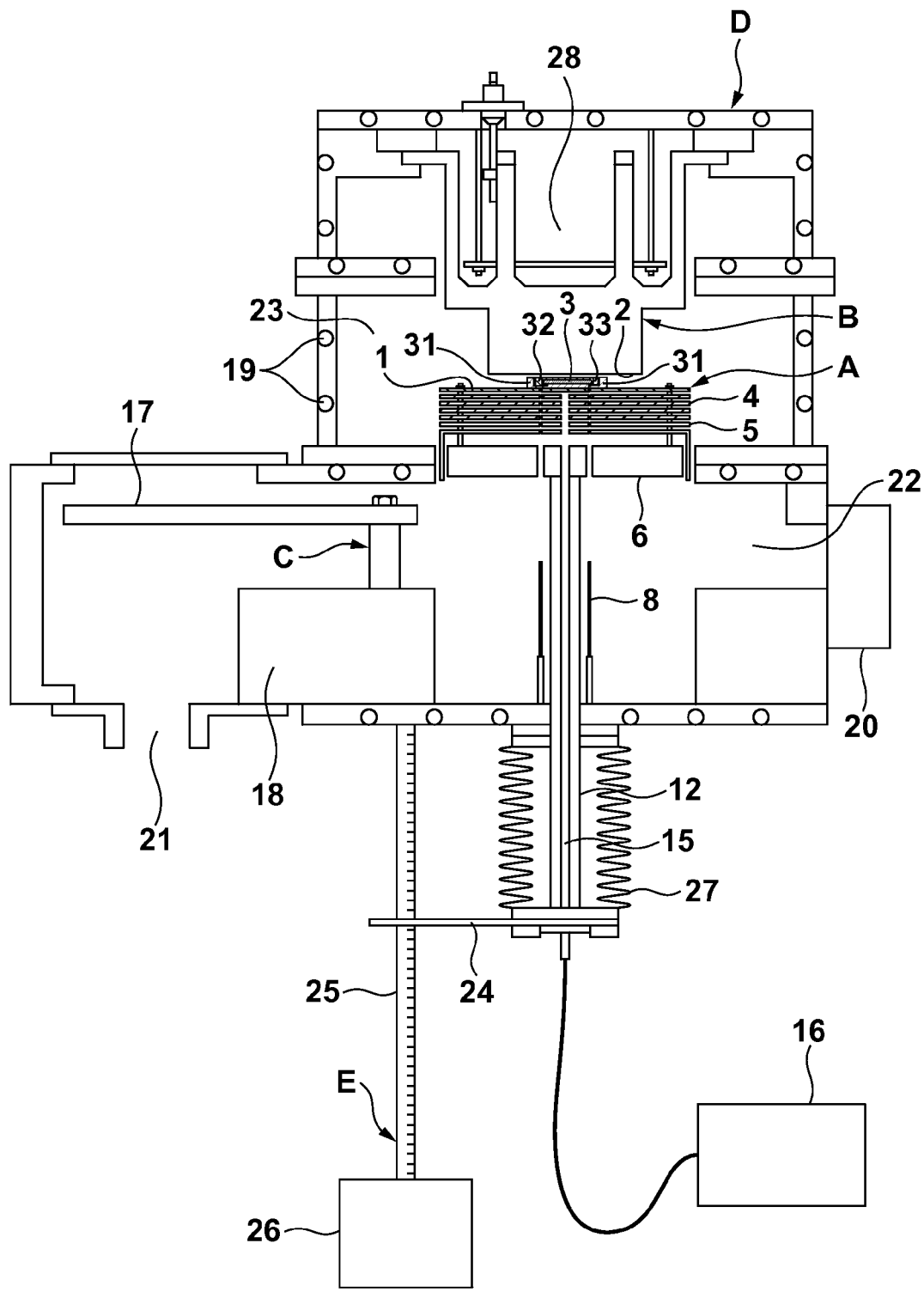
FIG. 2 is a schematic sectional view showing a state when the substrate is heated.
Figure 3:
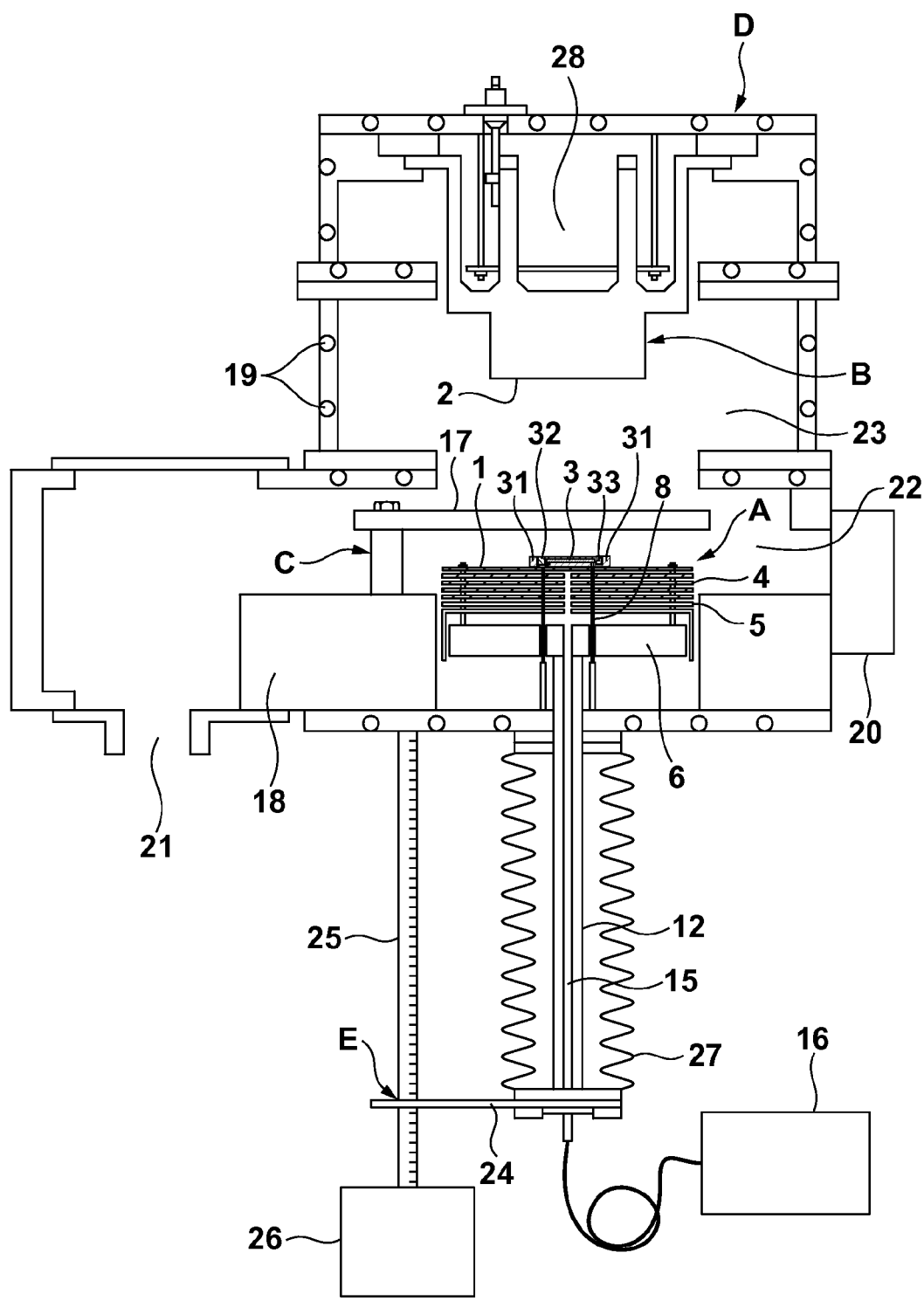
FIG. 3 is a schematic sectional view showing a state when the substrate is cooled.
Figure 4:
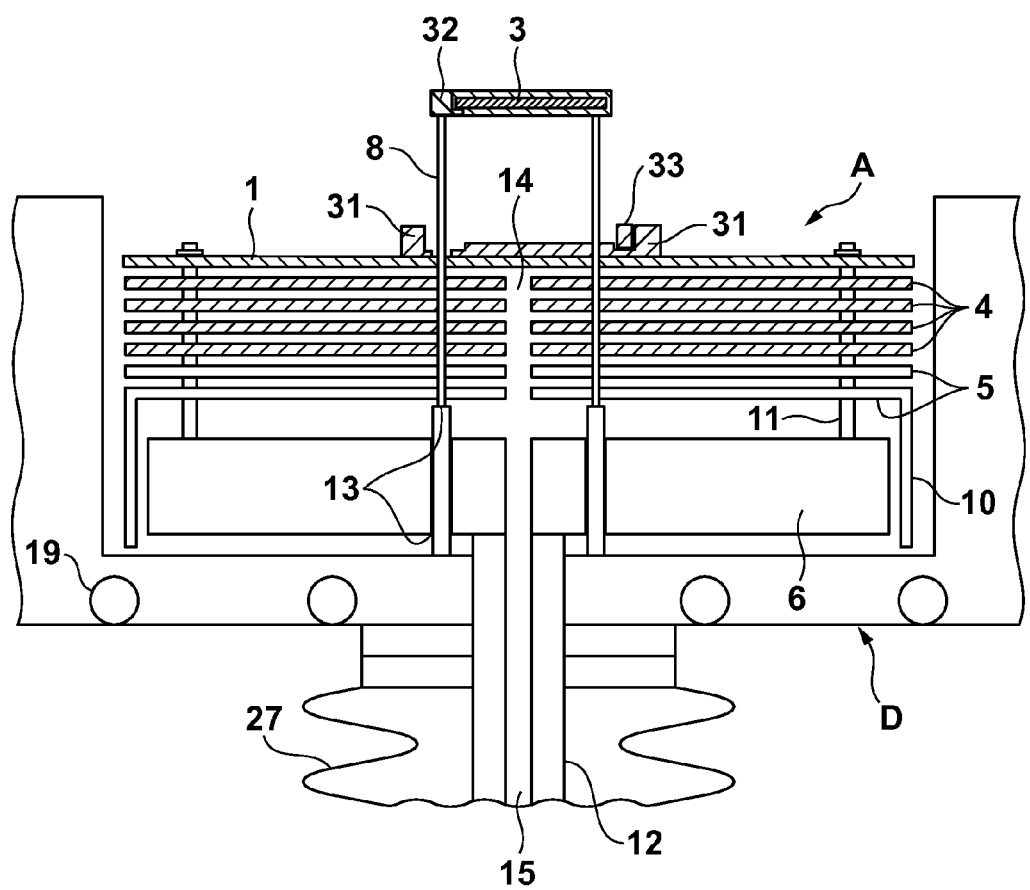
FIG. 4 is an enlarged sectional view showing the surroundings of a substrate holder unit in FIG. 1.
Figure 5:
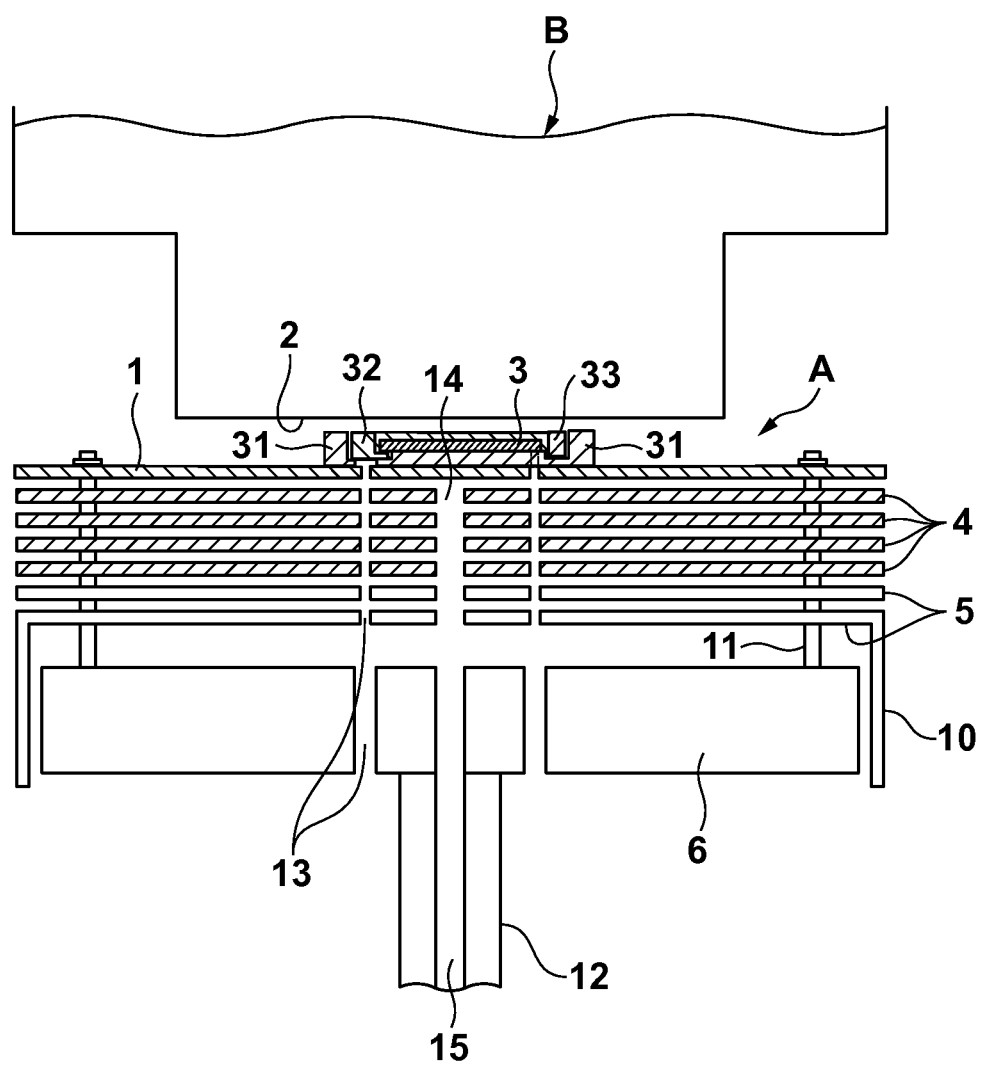
FIG. 5 is an enlarged sectional view showing the surroundings of the substrate holder unit in FIG. 2.

FIGS. 1, 2, and 3 show an outline of an overall substrate heat treatment apparatus according to the embodiment of the present invention. The substrate heat treatment apparatus performs heat treatment on a substrate in a vacuum processing chamber. FIG. 1 is a schematic sectional view showing a state when a substrate is loaded or unloaded. FIG. 2 is a schematic sectional view showing a state when the substrate is heated. FIG. 3 is a schematic sectional view showing a state when the substrate is cooled. FIG. 4 is an enlarged sectional view showing the surroundings of a substrate holder unit in FIG. 1. FIG. 5 is an enlarged sectional view showing the surroundings of the substrate holder unit in FIG. 2.

Figure 10:
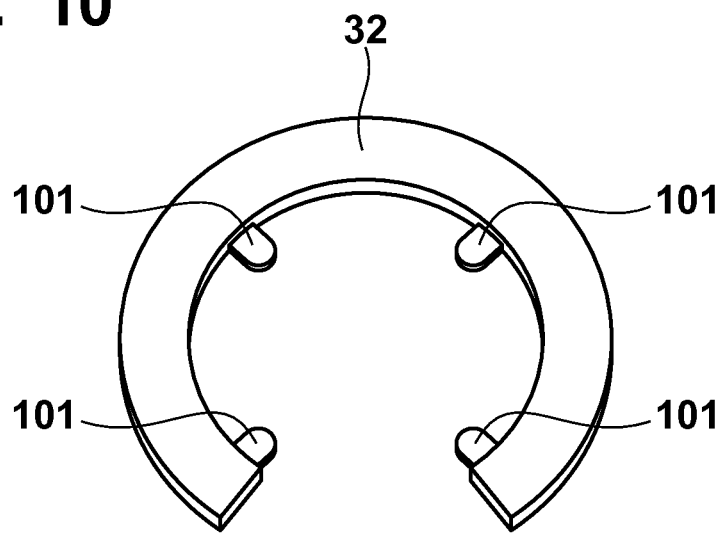
FIG. 10 is a perspective view for explaining the susceptor.

FIG. 6 is a perspective view showing a state in which a substrate 3 is placed on the placement portion of a susceptor 32 in FIG. 4. FIG. 10 is a perspective view for explaining the susceptor 32. As shown in FIG. 10, the susceptor 32 has a C shape in which an opening portion is formed in the circumferential direction of an annular shape. A plurality of claws 101 (first substrate placement portion) capable of placing the substrate 3 are formed inside the susceptor 32.

Figure 7:
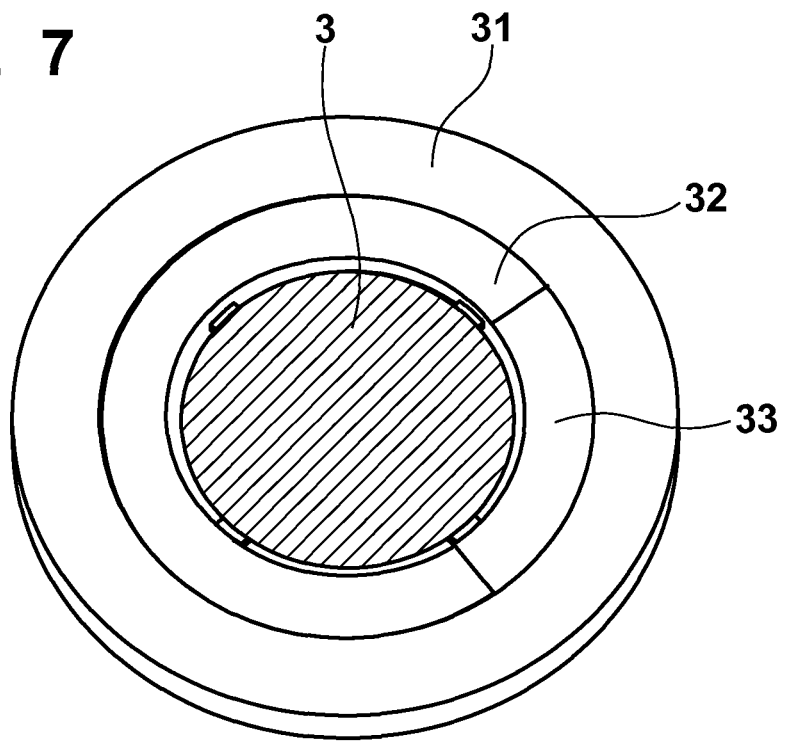
FIG. 7 is a perspective view showing a state in which the substrate is transferred to a substrate stage in FIG. 5.
Figure 8:
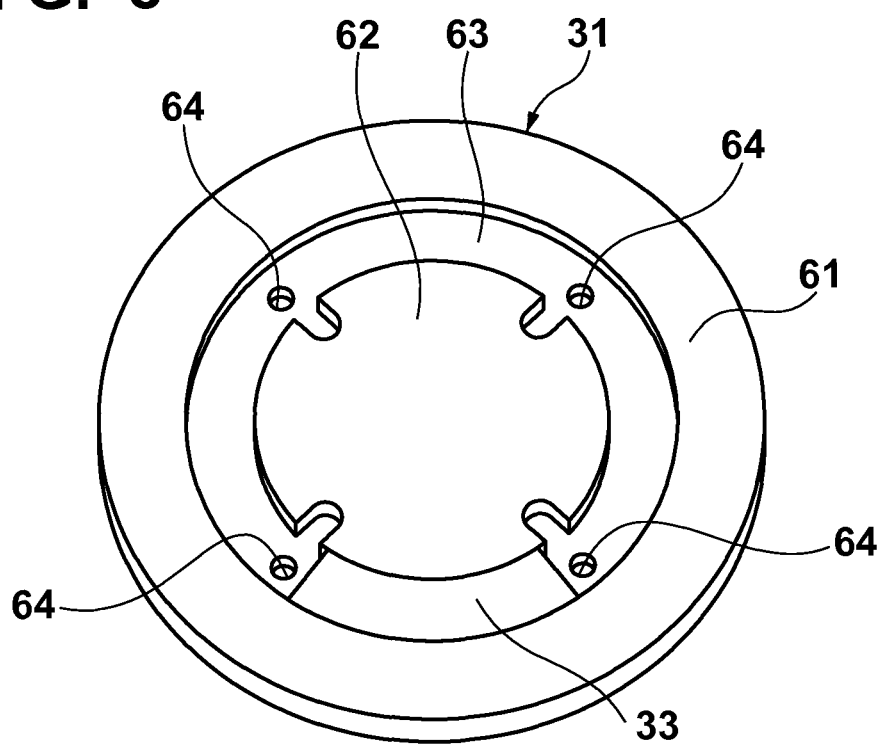
FIG. 8 is a schematic view for explaining a substrate holding portion.

FIG. 7 is a perspective view showing a state in which the substrate 3 is transferred to the placement portion of a substrate holding portion 31 in FIG. 5. FIG. 8 is a schematic view for explaining the substrate holding portion 31. The substrate holding portion 31 includes a placement portion 62 (second substrate placement portion) capable of placing a substrate, and a susceptor support portion (recessed portion 63) which supports the susceptor.

As shown in FIGS. 1 to 3, the substrate heat treatment apparatus according to the embodiment is constituted by arranging a substrate holder unit A, heating unit B, and shutter device C in a vacuum chamber D.

The substrate holder unit A includes a substrate stage 1 at the top. The heating unit B is arranged above the substrate stage 1, and includes a heat radiation surface 2 at a position at which it faces the placement portion 62 (second substrate placement portion) capable of placing a substrate. The heating unit B heats the substrate 3 placed on the placement portion 62 (second substrate placement portion) by heat from the heat radiation surface 2.

The substrate holder unit A can be moved up and down by an elevating device E. By the operation of the elevating device E, the substrate stage 1 and the heat radiation surface 2 of the heating unit B can be controlled to come close to or move apart from each other. The elevating device E (moving portion) moves the substrate stage 1 so that the placement portion 62 (second substrate placement portion) comes to a predetermined distant position with respect to the heat radiation surface 2. When the substrate 3 is placed on the placement portion 62, the distant position between the surface of the substrate 3 and the heat radiation surface 2 is controlled by the operation of the elevating device E in consideration of the thickness of the substrate 3. When the substrate holder unit A moves up, as shown in FIG. 2, and the substrate 3 on the substrate stage 1 and the heat radiation surface 2 come close to each other, the heating unit B heats the substrate 3 by radiant heat from the heat radiation surface 2 in a non-contact state with the substrate 3.

The substrate stage 1 includes the substrate holding portion 31 which holds the substrate 3. The placement portion 62 capable of placing the substrate 3 is arranged at the center on the upper surface of the substrate holding portion 31. As shown in FIG. 4, the susceptor 32 (to be described later) is lifted up by lift pins 8 (lift portion) while the substrate 3 is placed. In this state, the substrate 3 is transferred from/to an external transfer chamber (not shown). The transfer of the substrate 3 from/to the external transfer chamber (not shown) uses a substrate transport robot (not shown). A fork is arranged as an end effector at the distal end of the robot arm. When loading the substrate 3, the substrate transport robot moves down the fork from above the opening portion of the susceptor 32, and places, on the claws 101 (first substrate placement portion) of the susceptor 32, the substrate 3 placed on the fork. At the time of unloading, the substrate transport robot moves up the fork from below the opening portion of the susceptor 32, and transfers, onto the fork, the substrate 3 placed on the claws 101 of the susceptor 32. In this manner, the substrate transport robot transfers the substrate 3 having undergone heating treatment from the claws 101 (first substrate placement portion) of the susceptor 32 to the fork, and recovers the substrate 3 into the external transfer chamber.

As shown in FIGS. 2 and 5, when the substrate stage 1 is moved up by the lift pins 8 along with upward movement of the substrate holder unit A, the susceptor 32 is transferred together with the substrate 3 to the substrate holding portion 31 arranged on the substrate stage 1 (FIG. 5).

FIG. 8 is a perspective view showing the substrate holding portion 31. The substrate holding portion 31 is constituted by engaging a complementary block 33 with the susceptor support portion (recessed portion 63) of a substrate holding portion base 61. The complementary block 33 is formed separately from the susceptor support portion, engaged with the susceptor support portion, and complements the opening portion of the susceptor 32 to form the susceptor 32 into an annular shape in a state in which the susceptor support portion supports the susceptor 32. The C-shaped susceptor 32 whose opening portion is complemented by the complementary block 33 has an annular shape in combination with the complementary block 33. The complementary block 33 is arranged on the susceptor support portion (recessed portion 63) by fitting (engagement) with a gap with respect to the susceptor support portion (recessed portion 63), and is movable on the susceptor support portion (recessed portion 63). For example, even when the support position of the susceptor 32 shifts owing to thermal expansion or contraction by cooling in the susceptor 32, or the elevating operation by the lift pins 8, the shift of the support position of the susceptor 32 can be absorbed by moving the complementary block 33. Since the complementary block 33 is movable, this can prevent interference between members in which, for example, the susceptor 32 runs onto the complementary block 33 owing to shift of the support position of the susceptor 32.

When the substrate 3 is placed on the placement portion 62 (second substrate placement portion) of the substrate holding portion 31 and the second substrate placement portion is located at a predetermined distant position with respect to the heat radiation surface, the susceptor 32 forms an annular shape together with the complementary block 33 (complementary portion) and surrounds the substrate 3. The inner surface of the susceptor 32 and that of the complementary block 33 (complementary portion) surround the periphery of the substrate 3. By placing the substrate 3 on the placement portion 62 in this state, emission of heat from the periphery of the heated substrate 3 can be prevented.

Figure 9:
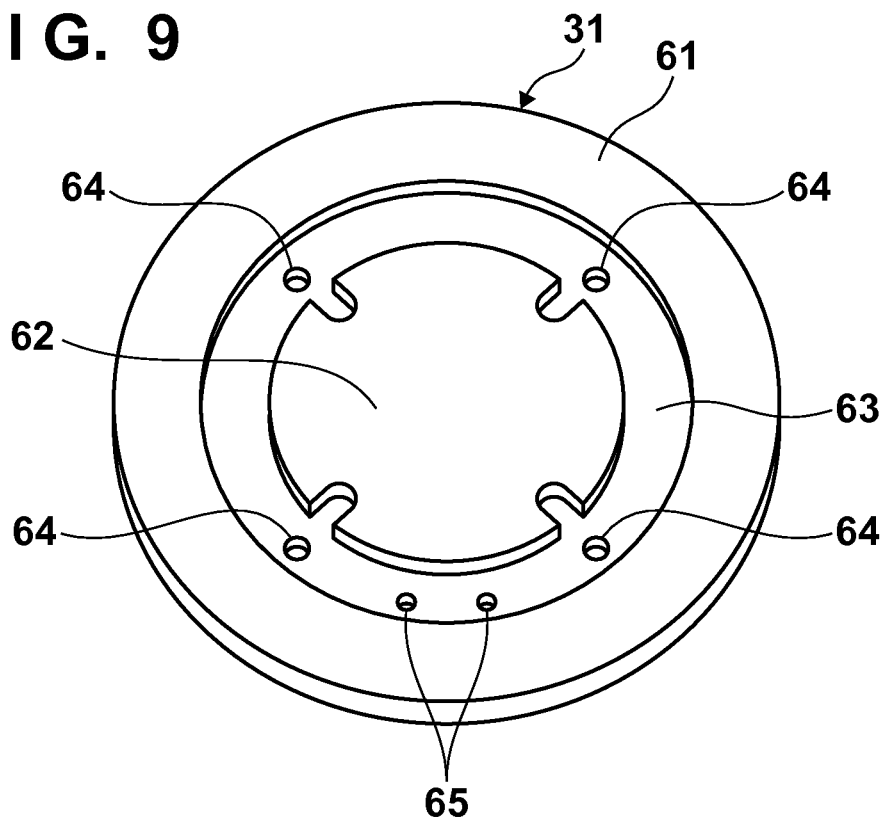
FIG. 9 is a schematic view for explaining a substrate holding portion base.
Figure 11A:
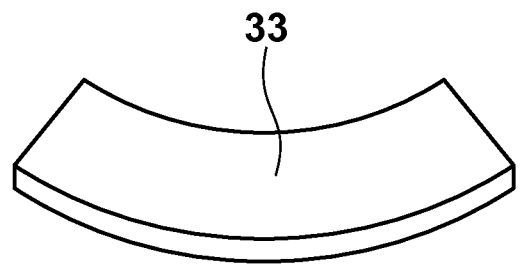
FIG. 11A is a schematic view for explaining a complementary block.
Figure 11B:
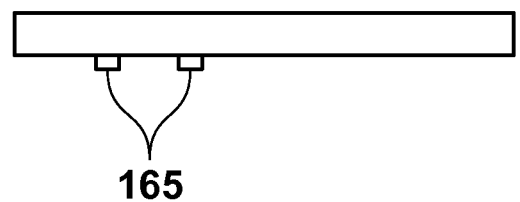
FIG. 11B is a sectional view showing the complementary block.

FIG. 9 is a perspective view showing the substrate holding portion base 61 in a state in which the complementary block 33 is dismounted. FIG. 11A is a perspective view for explaining the complementary block 33. FIG. 11B is a sectional view showing the complementary block 33 when viewed from the lateral (side surface) direction of the long side. As shown in FIG. 9, the placement portion 62 (second substrate placement portion) capable of placing the substrate 3 is arranged at the center of the substrate holding portion base 61. The annular recessed portion 63 which holds the susceptor 32 and complementary block 33 is arranged on the substrate holding portion base 61. The recessed portion 63 functions as the susceptor support portion. A plurality of lift pin through holes 64 through which the lift pins 8 extend, and a plurality of complementary block through holes 65 are formed at the bottom of the recessed portion 63. Note that the complementary block through hole 65 is not limited to the through hole and may be a groove. Projections 165 are formed on the lower surface (back surface) of the complementary block 33. The projections 165 are fitted in the complementary block through holes 65 by fitting (engagement) with gaps from the complementary block through holes 65.

The internal diameter of the complementary block through hole 65 is designed to be larger than the diameter of the projection 165. The difference (gap) in size between the internal diameter of the complementary block through hole 65 and the diameter of the projection 165 allows the complementary block 33 to move in the circumferential direction of the recessed portion 63 or the widthwise direction (radial direction) of the recessed portion 63. For example, the internal diameter of the complementary block through hole 65 is set to be larger than the diameter of the projection 165 by 0.5 mm to 1.0 mm.

When the substrate 3 is heated, the heat escapes from the gap between the susceptor 32 and the complementary block 33. To prevent this, the complementary block 33 and susceptor 32 are preferably arranged with a minimum gap in the circumferential direction of the recessed portion 63 when the susceptor 32 is arranged on the annular recessed portion 63. The upper surface of the placement portion 62 is configured to be at a lower level than the upper surface of the peripheral portion of the substrate holding portion base 61. To improve the heating efficiency by preventing escape of heat from the periphery of the substrate 3, the upper surface of the peripheral portion and that of the susceptor 32 are preferably set at a level at which the substrate 3 comes to a level lower than the upper surface of the peripheral portion and that of the susceptor 32 when the substrate 3 is placed on the placement portion 62.

Figure 12:
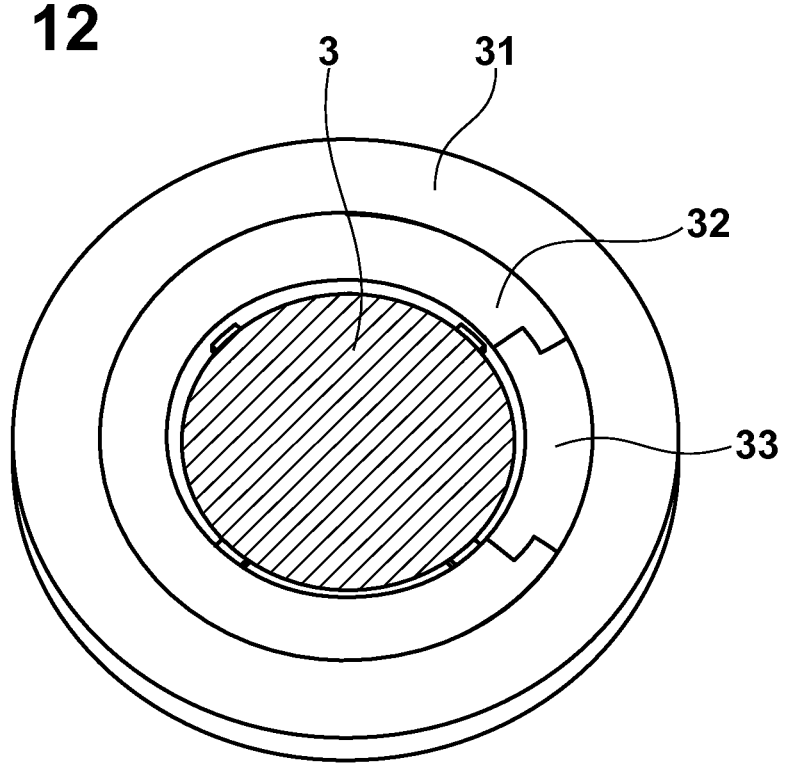
FIG. 12 is a schematic view showing another example of the complementary block and substrate susceptor.

Both the complementary block 33 and susceptor 32 are preferably made of the same material which has high emissivity and can efficiently radiate absorbed heat. For example, pyrolytic carbon (PG) or high-purity carbon is available. Note that the susceptor 32 and complementary block 33 may have a meshing structure, as shown in FIG. 12. The meshing structure is preferable because it prevents escape of heat from the gap between the susceptor 32 and the complementary block.

As shown in FIG. 5, when the substrate 3 is heated by the heating unit B, the susceptor 32 and complementary block 33 are also heated by radiant heat from the heating unit B. In the embodiment, the complementary block 33 is constructed separately from the substrate holding portion base 61. The susceptor 32 is also constructed separately from the substrate holding portion base 61. Heat transferred from the susceptor 32 and complementary block 33 to the substrate holding portion base 61 is reduced at the boundary between the complementary block 33 and the substrate holding portion base 61. Similarly, the heat is also reduced at the boundary between the susceptor 32 and the substrate holding portion base 61. When the complementary block 33 and susceptor 32 are made of the same material, the heat conductivity from the complementary block 33 to the substrate holding portion base 61 and the heat conductivity from the susceptor 32 to the substrate holding portion base 61 become equal.

This arrangement can eliminate portions of the susceptor 32 and complementary block 33 surrounding the periphery of the substrate 3 at which the temperature becomes low locally. Also, this arrangement can prevent local cooling of the substrate 3 which is placed on the placement portion 62 and heated. Even when the substrate 3 is heated quickly, the uniformity of the in-plane temperature distribution of the substrate can be improved.

To the contrary, in a shape in which the susceptor main body has at its periphery a notch in which a horseshoe susceptor is fitted, as in cited literature 1, a portion (for example, an upright edge and notch) complementing the horseshoe susceptor is formed together with the susceptor main body. At the complementary portion, heat is not reduced and transfers to the susceptor main body. The heat transferring from the horseshoe susceptor to the susceptor main body is reduced, compared to the integrally formed complementary portion. The temperature of the horseshoe susceptor becomes higher than that of the complementary portion, and a temperature difference is generated between the horseshoe susceptor and the complementary portion. This leads to a temperature difference between a portion of the substrate that is placed on the susceptor main body, and a portion of the substrate that is placed on the horseshoe susceptor. As a result, the substrate is not heated uniformly.

When the substrate 3 is transferred to the placement portion 62 (second substrate placement portion) of the substrate holding portion 31, the upper surface of the substrate 3 is placed at a position lower than the upper surface of the susceptor 32. When heating the substrate 3, the periphery (end portion) of the substrate 3 is surrounded by the inner surfaces of the susceptor 32 and complementary block 33, as shown in FIG. 7. By holding the substrate 3 by the substrate holding portion 31 in this state, emission of heat from the periphery (end portion) of the heated substrate 3 can be prevented.

Since the outer surfaces of the susceptor 32 and complementary block 33 are surrounded by the inner surface of the substrate holding portion 31, as shown in FIG. 7, emission of heat from the periphery (end portion) of the substrate 3 can be further prevented. Even if the substrate is not completely transferred to the placement portion 62, the substrate 3 may be heated by the claws 101 (first substrate placement portion) in a state in which the substrate 3 is held on the claws 101 (first substrate placement portion).

The substrate stage 1 is made of a material which has high emissivity, can efficiently absorb radiant heat, efficiently radiate the absorbed heat, and can resist high heat. More specifically, the substrate stage 1 is a plate made of carbon or a carbon-coated material. Examples of carbon constituting the substrate stage 1 are glassy carbon, graphite, and pyrolytic carbon (PG). An example of the carbon-coated material is a material obtained by coating ceramics with one or two or more types of these carbons.

The substrate holder unit A includes the substrate stage 1 at the top, a radiation plate 4 below the substrate stage 1, reflecting plates 5 below the radiation plate 4, and a cooling panel 6 at the bottom.

Similar to the substrate stage 1, the radiation plate 4 is a plate made of carbon or a carbon-coated material, and is arranged at an interval below the substrate stage 1. The radiation plate 4 is arranged to face the lower surface of the substrate stage 1. When the substrate 3 is heated, the radiation plate 4 captures heat radiated from the lower surface of the substrate stage 1 and radiates the captured heat to the substrate stage 1. This can suppress a temperature drop of the substrate stage 1 by heat radiation, facilitating quick heating.

The two reflecting plates 5 are arranged at an interval on the lower side of the radiation plate 4 (when one radiation plate 4 is used, on the lower side of the radiation plate 4, and when a plurality of radiation plates 4 are arranged, on the lower side of the lowermost radiation plate 4). The reflecting plate 5 is made of a refractory metal such as molybdenum or tungsten, an alloy such as a nickel alloy or nickel-base superalloy, a metal carbide, or a metal nitride. At least a surface (upper surface) of the reflecting plate 5 on the side of the radiation plate 4 is mirror-finished. The reflecting plate 5 reflects heat radiated from the substrate stage 1 and radiation plate 4.

The cooling panel 6 is, for example, a panel body cooled by a water cooling mechanism or the like, and is arranged to face the lower surfaces of the substrate stage 1, radiation plate 4, and reflecting plate 5. When cooling the substrate 3, the cooling panel 6 can uniformly, rapidly cool these members positioned above it.

The substrate stage 1, radiation plate 4, and reflecting plate 5 are supported on the cooling panel 6 by coupling screws 11 via a heat-resistant/adiabatic material such as alumina ceramics or zirconium oxide ceramics. The cooling panel 6 is connected to the distal end of an elevating shaft 12 of the elevating device E (see FIG. 1). As will be described later, the elevating device E moves up and down the cooling panel 6 in the axial direction of the elevating shaft 12. As the cooling panel 6 moves up and down, the substrate holder unit A built above the cooling panel 6 is moved up and down.

In the substrate holder unit A, lift pin through holes extending through the substrate stage 1, radiation plate 4, reflecting plate 5, and cooling panel 6 constituting the substrate holder unit A are formed at a plurality of portions. The plurality of lift pins 8 stand at the bottom of the vacuum chamber D in correspondence with the positions of the lift pin through holes. The lift pin 8 is preferably made of a plurality of different members (building members). For example, when the lift pin 8 is constituted by three members, it includes the first member which abuts against the lower surface of the susceptor 32 at one end, the second member connected to the other end of the first member, and the third member connected to the other end of the second member. In this case, the emissivities of the respective building members have a relation: the emissivity of the first member>the emissivity of the second member>the emissivity of the third member. In this fashion, the emissivity of the lift pin 8 on the side of the substrate stage 1 is set to be higher. This can reduce heat radiation from the susceptor 32 which contacts the distal end of the lift pin 8. Note that the structure of the lift pin 8 is merely an example, and the gist of the present invention is not limited to the case in which the lift pin 8 is constituted by three members.

As a member (first member) of the lift pin 8 that is closest to the susceptor 32, pyrolytic carbon (PG) which has high emissivity and is capable of heating to high temperature by radiation, similar to the substrate stage 1, is preferably used. The second member on the lower end side of the first member is desirably made of a carbide such as tantalum carbide (TaC), titanium carbide (TiC), or tungsten carbide (WC) which is lower in emissivity and heat conductivity than the first member. The third member which is arranged on the lower end side of the second member and connected to the water cooling panel is preferably made of a refractory metal such as molybdenum (Mo), tantalum (Ta), or tungsten (W), or a carbide such as tantalum carbide (TaC). The third member is preferably lower in emissivity and heat conductivity than the second member.

By constituting the lift pin 8 from a plurality of different members, as described above, dissipation of heat from the susceptor 32 to the cooling panel 6 through the lift pins 8 can be suppressed even when the susceptor 32 is supported by the lift pins 8, as shown in FIGS. 4 and 6. Accordingly, crystal distortion of a substrate by local quenching of the substrate when unloading the substrate is suppressed.

In FIG. 4, the plurality of lift pins 8 standing at the bottom of the vacuum chamber D project on the substrate stage 1 through lift pin through holes 13. The lift pins 8 are arranged at positions at which they can lift and support the susceptor 32 by their distal ends. A necessary number of lift pins 8 for supporting the susceptor 32 are disposed. When the substrate holder unit A moves up from the state of FIG. 4 and the substrate stage 1 moves to above the lift pins 8, the susceptor 32 is supported by the susceptor support portion of the substrate holding portion 31, and the substrate 3 is placed on the placement portion (second substrate placement portion) of the substrate holding portion 31.

When the substrate holder unit A moves down in a state in which the susceptor support portion supports the susceptor 32 and the substrate 3 is placed on the placement portion 62, the lift pins 8 project on the substrate stage 1 via the lift pin through holes 13. Then, the susceptor 32 is lifted and supported by the distal ends of the lift pins 8, and changes to the state of FIG. 4.

A measurement hole 14 is formed immediately below the center of the substrate holding portion 31 of the substrate stage 1 and extends through the radiation plate 4, reflecting plate 5, and cooling panel 6. The measurement hole 14 is series-connected to a measurement hole 15 formed at the center of the elevating shaft 12. The measurement holes 14 and 15 are used to measure radiant heat from the substrate stage 1 via a quartz thermal infrared transmitting window by a temperature measurement unit 16 shown in FIG. 1. As the temperature measurement unit, a radiation thermometer is usable.

The heating unit B includes the heat radiation surface 2, and a heater 28 for heating the heat radiation surface 2. As the heater, an electron bombardment heating type heater, high-frequency induction heating type heater, resistance heating type heater, or the like is usable. The heat radiation surface 2 is a heat-resistant black surface, and is obtained by carbon coating of glassy carbon, pyrolytic carbon, amorphous carbon, or the like. When the heat radiation surface 2 is such a carbon coating surface, degassing and generation of a particle in a vacuum can also be suppressed.

As shown in FIGS. 1 to 3, when the substrate holder unit A moves down to space the substrate stage 1 and the heat radiation surface 2 of the heating unit B apart from each other, the shutter device C can insert/retract a shutter 17 into/from a gap between the substrate stage 1 and the heat radiation surface 2. The shutter device C includes a shutter driving device 18 for inserting/retracting the shutter 17.

The shutter 17 functions as a heat partition. As shown in FIGS. 1 and 3, when the substrate holder unit A moves down to space the substrate stage 1 and heat radiation surface 2 apart from each other, the shutter 17 is inserted between the substrate stage 1 and the heat radiation surface 2 to block irradiation of the substrate stage 1 with heat from the heat radiation surface 2. When the substrate holder unit A moves up, the shutter 17 is rotated and moved by the shutter driving device 18 and retracts from the gap between the substrate stage 1 and the heat radiation surface 2 to a position shown in FIG. 2 (indicated by a broken line in FIG. 1). After the substrate holder unit A moves up, the shutter 17 stays at the retraction position until the substrate holder unit A moves down again to a position at which the shutter 17 does not hinder the substrate holder unit A.

The shutter device C preferably includes a cooling unit for the shutter 17, such as a water cooling mechanism, so as to promote cooling of the substrate stage 1 and the substrate 3 on the substrate stage 1 when the shutter 17 is inserted. In cooling by the cooling unit, the shutter 17 can be made of stainless steel or an aluminum alloy. A surface (upper surface) of the shutter 17 that faces the heat radiation surface 2 of the heating unit B when the shutter 17 is inserted is preferably a mirror-finished reflecting surface so as to easily block heat from the heat radiation surface 2. A surface (lower surface) of the shutter 17 that faces the substrate stage 1 of the substrate holder unit A when the shutter 17 is inserted is preferably an endothermic surface serving as a heat-resistant black surface so as to rapidly cool the substrate stage 1 and the substrate 3 on the substrate stage 1. The endothermic surface is obtained by making the wall surface of a black material such as black anodized aluminum, and can also be obtained by, for example, carbon coating of glassy carbon, pyrolytic carbon, amorphous carbon, or the like.

When the substrate stage 1 and the substrate 3 on the substrate stage 1 are positively cooled by the shutter 17, the lowered position of the substrate holder unit A is preferably set at two steps. More specifically, the lowered position is preferably set at two steps: a cooling position at which the substrate stage 1 and substrate 3 are close to the lower surface of the shutter 17, and a loading/unloading position (substrate acceptance position) at which an interval enough to load/unload the substrate 3 is obtained between the substrate stage 1 and substrate 3, and the lower surface of the shutter 17. The cooling position is the position of the substrate holder unit A shown in FIG. 3. The loading/unloading position (substrate acceptance position) is the position of the substrate holder unit A shown in FIG. 1.

The cooling unit of the shutter 17 can also be omitted depending on the heating temperature region of the substrate 3. In this case, the shutter 17 is preferably made of a refractory metal such as molybdenum or tungsten. Even when no cooling unit is arranged, a surface of the shutter 17 that faces the heat radiation surface 2 is preferably a reflecting surface, and a surface of the shutter 17 that faces the substrate stage 1 is preferably an endothermic surface, in order to block heat from the heat radiation surface 2 and promote cooling of the substrate stage 1 and the substrate 3 on the substrate stage 1.

The vacuum chamber D is a housing made of an aluminum alloy or the like, and water cooling channels 19 of a water cooling mechanism are formed in the wall. The vacuum chamber D also includes a slit valve 20 which is opened/closed when loading/unloading the substrate 3, and an exhaust port 21 which is connected to an exhaust system to evacuate the inside to a vacuum atmosphere. By supplying cooling water to the water cooling channels 19, the temperature of the housing of the vacuum chamber D can be prevented from rising excessively.

The vacuum chamber D includes a lower first chamber 22, and a second chamber 23 which is positioned above the first chamber 22 and communicates with it. The heating unit B is arranged in the second chamber 23 positioned above, with the heat radiation surface 2 facing down. The substrate holder unit A can move up/down between the first chamber 22 and the second chamber 23. When the substrate holder unit A moves up, the substrate stage 1 and the heat radiation surface 2 of the heating unit B come close to each other in a state in which the cooling panel 6 closes the boundary between the first chamber 22 and the second chamber 23, as shown in FIG. 2. The substrate 3 is then heated, heat generated in the second chamber 23 hardly leaks to the lower first chamber 22, and cooling performed by moving down the substrate holder unit A to the first chamber 22 after heating can be performed more rapidly. The inner surface of the vacuum chamber D, especially the inner surface of the second chamber 23 is preferably mirror-finished to increase the heating efficiency.

The elevating device E includes the elevating shaft 12 having an upper end connected to the cooling panel 6 of the substrate holder unit A, an elevating arm 24 attached to the lower end portion of the elevating shaft 12, and a ball screw 25 with which the elevating arm 24 is screwed. The elevating device E also includes a rotation driving device 26 capable of rotating the ball screw 25 both clockwise and counterclockwise, and a bellows cover 27 which covers a sliding portion between the elevating shaft 12 and the vacuum chamber D, enhances airtightness in the vacuum chamber D, and expands and contracts along with vertical movement of the elevating shaft 12. The elevating device E moves up or down the elevating arm 24 screwed with the ball screw 25 by rotating the ball screw 25 clockwise or counterclockwise by the rotation driving device 26. Along with this, the elevating device E vertically slides the elevating shaft 12 to move up or down the substrate holder unit A.

Note that the vacuum chamber has been described above. However, when a vacuum chamber is not used, the inside of the chamber needs to be filled with an inert gas such as argon gas.

Next, the driving state of the substrate heat treatment apparatus will be described.

First, as shown in FIG. 1, the slit valve 20 is opened to load the substrate 3 into the vacuum chamber D. For example, the substrate 3 can be loaded by introducing the substrate 3 into the vacuum chamber D by a robot, and placing and supporting the substrate 3 on the susceptor 32, as shown in FIGS. 1 and 4, which will be described later.

The portion of the slit valve 20 of the vacuum chamber D is generally coupled to a load/unload lock chamber (not shown) via a transfer chamber (not shown) in which a robot is accommodated. The substrate 3 is first set in the load/unload lock chamber. After rough evacuation of the inside of the chamber, the boundary between the load/unload lock chamber and the transfer chamber is opened. After further evacuation, the slit valve 20 is opened, and the robot in the transfer chamber places the substrate 3 on the susceptor 32 from the load/unload lock chamber by pick-and-place. A fork is arranged as an end effector at the distal end of the robot arm. When loading the substrate 3, the fork of the robot arm moves down from above the opening portion of the susceptor 32. By this fork movement, the substrate 3 placed on the fork is placed on the claws 101 of the susceptor 32. When unloading the substrate 3, the fork of the robot arm moves up from below the opening portion of the susceptor 32. By this fork movement, the substrate 3 placed on the claws 101 of the susceptor 32 is placed on the fork. The fork on which the substrate 3 is placed is retracted from the opening portion of the susceptor 32, and the substrate 3 can be discharged.

After the substrate 3 is placed on the claws 101 of the susceptor 32, the robot arm is retracted and the slit valve 20 is closed. After the inside of the vacuum chamber D becomes an independent vacuum chamber, the shutter 17 is retracted, and the substrate holder unit A is moved up. After the substrate 3 placed on the claws 101 of the susceptor 32 is scooped up by the substrate holding portion 31, the substrate holder unit A is further moved up to bring the substrate stage 1 and the heat radiation surface 2 of the heating unit B close to each other, as shown in FIGS. 2 and 5. At this time, it is necessary that at least the substrate 3 does not contact the heat radiation surface 2. The interval between the heat radiation surface 2 and the substrate 3 is preferably 1 to 25 mm though it depends on the sizes of the heat radiation surface 2 and substrate 3, the heating temperature, the heating power of the heating unit B, and the like.

After that, the heater 28 of the heating unit B is turned on to heat the substrate 3 by radiant heat from the heat radiation surface 2. For example, when the heating temperature is 1,900° C., heating continues until the temperature of the substrate stage 1 that is measured by the temperature measurement unit 16 reaches 1,900° C. After the temperature reaches 1,900° C., this temperature is held till the lapse of a predetermined anneal time (for example, about 1 min).

Upon the lapse of the anneal time, the heater 28 of the heating unit B is turned off, and natural cooling starts. At the same time, the substrate holder unit A is moved down to the above-mentioned cooling position (position at which the substrate stage 1 and the substrate 3 contact the lower surface of the shutter 17). The shutter 17 is then inserted between the substrate stage 1 of the substrate holder unit A and the heat radiation surface 2 of the heating unit B to promote cooling. The substrate 3 is cooled to a temperature (for example, 200° C.) at which the substrate 3 can be extracted without any problem. After cooling, the substrate holder unit A is moved down to the above-mentioned loading/unloading position (position at which an interval enough to load/unload the substrate 3 is obtained between the substrate stage 1 and substrate 3, and the lower surface of the shutter 17). While the substrate holder unit A is moved down from the cooling position to the loading/unloading position, the susceptor 32 is transferred onto the lift pins 8 so that the substrate 3 placed on the claws 101 of the susceptor 32 can be easily extracted. After the substrate holder unit A is moved down to the loading/unloading position, the slit valve 20 is opened, and the substrate 3 is extracted from the susceptor 32 by the fork at the distal end of the robot arm of the transfer chamber (not shown).

When heating the substrate 3, the susceptor 32 is heated at high temperature, and when extracting the substrate 3, is cooled to a temperature at which the substrate 3 can be extracted without any problem. Hence, the susceptor 32 thermally expands by heating, and then contracts by cooling. Since the susceptor 32 is moved up/down by the lift pins 8, the support position of the susceptor 32 on the lift pins 8 may shift under the influence of thermal expansion, contraction, and the elevating operation. However, the complementary block 33 is arranged at the recessed portion 63 by fitting (engagement) with a gap with respect to the susceptor support portion (recessed portion 63). Thus, when the susceptor 32 is transferred onto the recessed portion 63, it does not run onto the complementary block 33. As a result, the interval between the heat radiation surface 2 of the heating unit B and the substrate 3 becomes uniform, and the substrate 3 can be heated uniformly.

The present invention is not limited to the above-described embodiment, and various changes and modifications can be made within the spirit and scope of the present invention. Therefore, to apprise the public of the scope of the present invention, the following claims are made.

The invention claimed is:

1. A substrate heat treatment apparatus which performs heat treatment on a substrate in a vacuum processing chamber, comprising:

a C-shaped susceptor including a C shape portion in which an opening portion is formed in a circumferential direction of an annular shape, and a claw portion capable of supporting the substrate which claw portion is formed inside the C shape portion;

a substrate holding portion configured to hold the substrate, wherein the substrate holding portion includes: a substrate holding portion base; a placement portion which has a portion capable of supporting the substrate and is arranged at a center of the substrate holding portion base and has substantially a same size as a size of the substrate; and a susceptor support portion having an annular recessed portion configured to support the C-shaped susceptor;

a substrate stage formed separately from the substrate holding portion, wherein the substrate holding portion is arranged on the substrate stage;

a heating unit, including a heat radiation surface at a position above the substrate stage at which the heat radiation surface faces the placement portion, configured to heat the substrate placed on the placement portion by heat from the heat radiation surface;

a moving unit configured to move the substrate stage to set the placement portion at a predetermined position with respect to the heat radiation surface;

a lift portion configured to come into contact with a lower surface of the susceptor at a substrate acceptance position and support the susceptor in a state in which the susceptor is spaced apart from the susceptor support portion; and a complementary portion formed separately from the susceptor support portion, engaged with the susceptor support portion, and configured to complement the opening portion of the susceptor such that the complementary portion and the susceptor are in an annular shape in a state in which the susceptor support portion supports the susceptor, wherein a recess portion, which is configured to be engaged with the claw portion, is formed in a peripheral portion of the placement portion, wherein when the substrate is placed on the placement portion and the placement portion is located at the predetermined position with respect to the heat radiation surface, the susceptor forms the annular shape together with the complementary portion to surround a peripheral portion of the substrate, and an inner surface of the substrate holding portion base is configured to surround an outer surface of the C-shaped susceptor and an outer surface of the complementary portion.

2. The substrate heat treatment apparatus according to claim 1, wherein when the moving unit moves the substrate stage in a direction in which the substrate stage comes close to the heat radiation surface, the susceptor moves apart from the lift portion and is supported by the susceptor support portion.

3. The substrate heat treatment apparatus according to claim 1, wherein when the susceptor support portion holds the susceptor, the placement portion supports the substrate placed on the claw portion.

4. The substrate heat treatment apparatus according to claim 1, wherein when the moving unit moves the substrate stage in a direction in which the substrate stage moves apart from the heat radiation surface, the lift portion comes into contact with the lower surface of the susceptor and supports the susceptor at an upper position with respect to the substrate stage.

5. The substrate heat treatment apparatus according to claim 1, wherein an upper surface of the susceptor is formed to arrange an upper surface of the substrate at a position lower than the upper surface of the susceptor when the substrate is placed on the claw portion.

6. The substrate heat treatment apparatus according to claim 1, wherein the susceptor and the complementary portion are formed from the same material.

7. The substrate heat treatment apparatus according to claim 1, wherein the claw portion is configured to have a plurality of claws capable of supporting the substrate, and
a peripheral portion of the placement portion is configured to have a plurality of recess portions capable of engaging with the plurality of claws.

8. The substrate heat treatment apparatus according to claim 1, wherein a bottom portion of the susceptor support portion is configured to have a through hole, and
a bottom portion of the complementary portion is configured to have a projection portion, the projection portion is fitted in the through hole by fitting with a gap from the through hole.

9. The substrate heat treatment apparatus according to claim 1, wherein when the substrate is placed on the placement portion, an upper surface of the placement portion is configured to be lower than an upper surface of a peripheral portion of the substrate holding portion base.

10. The substrate heat treatment apparatus according to claim 1, wherein the substrate stage is configured to be made of a material capable of absorbing radiant heat radiated by the heating unit and radiating the absorbed heat and resisting high heat.

11. The substrate heat treatment apparatus according to claim 1, wherein an end portion of the opening portion of the C-shaped susceptor and an end portion of the complementary portion are configured to have a meshing structure.

12. The substrate heat treatment apparatus according to claim 11,
wherein in the meshing structure, the end portion of the complementary portion is configured to include a convex portion and a concave portion which are formed in a circumferential direction of the annular shape, the end portion of the opening portion of the C-shaped susceptor is configured to include a concave portion and a convex portion which are formed in a circumferential direction of the annular shape,
in a state in which the C-shaped susceptor and the complementary portion are supported on the susceptor support portion,
the convex portion, formed in the circumferential direction of the annular shape at the end portion of the complementary portion, is configured to be engaged with the concave portion formed in the circumferential direction of the annular shape at the end portion of the opening portion of the C-shaped susceptor, and
the concave portion, formed in the circumferential direction of the annular shape at the end portion of the complementary portion, is configured to be engaged with the convex portion formed in the circumferential direction of the annular shape at the end portion of the opening portion of the C-shaped susceptor.

* * * * *